US007091633B2

(12) United States Patent
Castagnet et al.

(10) Patent No.: US 7,091,633 B2
(45) Date of Patent: Aug. 15, 2006

(54) CURRENT-LIMITING LOGIC INTERFACE CIRCUIT

(75) Inventors: Thierry Castagnet, Tours (FR); Olivier Ladiray, Montlouis sur Loire (FR)

(73) Assignee: STMicroelectronics S.A., Montrouge (FR)

( * ) Notice: Subject to any disclaimer, the term of this patent is extended or adjusted under 35 U.S.C. 154(b) by 546 days.

(21) Appl. No.: 10/242,518

(22) Filed: Sep. 12, 2002

(65) Prior Publication Data

US 2003/0048008 A1 Mar. 13, 2003

(30) Foreign Application Priority Data

Sep. 12, 2001 (FR) .................................. 01 11784

(51) Int. Cl.
*H01H 35/00* (2006.01)
*H02H 3/08* (2006.01)
*H02H 9/02* (2006.01)
*H02H 3/00* (2006.01)
*H02H 7/00* (2006.01)

(52) U.S. Cl. ...................... 307/131; 307/412; 307/413; 361/93.1; 361/93.9; 361/101

(58) Field of Classification Search ................ 307/131, 307/412, 413; 361/93.1, 93.9, 101
See application file for complete search history.

(56) References Cited

U.S. PATENT DOCUMENTS 5,444,309 A 8/1995 Innes et al.
5,726,853 A * 3/1998 Chavannes ................... 361/119
6,336,448 B1 * 1/2002 Furuhata et al. ............. 123/644

FOREIGN PATENT DOCUMENTS

FR 2 399 644 A 3/1979

\* cited by examiner

*Primary Examiner*—Brian Sircus
*Assistant Examiner*—Hal I. Kaplan
(74) *Attorney, Agent, or Firm*—Lisa K. Jorgenson; William R. McClellan; Wolf, Greenfield & Sacks, P.C.

(57) ABSTRACT

A circuit of interface between a logic sensor and a logic input isolation barrier of a processing circuit, including an element of protection against input overvoltages, a current-limiting circuit connected in series between an input terminal and an output terminal of the interface circuit, and a control stage connected in parallel with the galvanic isolation element to be controlled to control the logic states thereof, the control stage inhibiting the operation of the galvanic isolation element if the input current is smaller than a predetermined threshold.

14 Claims, 2 Drawing Sheets

CURRENT-LIMITING LOGIC INTERFACE CIRCUIT

BACKGROUND OF THE INVENTION

1. Field of the Invention

The present invention relates to an interface circuit between a logic sensor and an isolation barrier of a logic input of a processing circuit. The present invention generally applies to input/output circuits of logic processing circuits. These are, for example, input/output circuits of programmable controllers or the like.

2. Discussion of the Related Art

Logic inputs of processing circuits are most often intended to detect a logic state transmitted by a sensor, for example, a two-point sensor, a three-point sensor, a proximity switch or the output of a relay. The data are collected by a system powered by a D.C. voltage. A low logic level is generally represented by the most negative voltage of the power supply (generally, 0 volt) and a high logic level is most often represented by the most positive voltage (Vcc).

FIG. 1 schematically and partially shows a first conventional example of an interface circuit 1 of the type to which the present invention applies. A sensor 3 most often formed of a switch 31 is supplied by a voltage V, provided, for example, by a battery 4 or a D.C. power supply. The reference voltage of supply voltage 4 is common with that of interface circuit 1. In the example of FIG. 1, circuit 1 is formed by means of passive discrete elements, more specifically a bridge of resistors R, R1, R2 filtered at the output by a capacitor C. In other words, an electrode of capacitor C and a terminal of resistor R2 are connected to reference terminal 5 of application of voltage V. Sensor 3 is connected in series with generator 4 between terminal 5 and an input terminal 6 of the interface circuit corresponding to a first terminal of resistor R1. The other terminal of resistor R1 is connected to the second terminal of resistor R2 and to the second electrode of capacitor C defining an output terminal 7 of interface circuit 1. Most often, a protection resistor R is interposed between sensor 3 and terminal 6. Capacitor C is in parallel with a galvanic isolation element, in this example an optocoupler 2. Optocoupler 2 is formed of a photodiode 8 controlling a switch 9. The two terminals of photodiode 8 are connected to the electrodes of capacitor C while the two terminals of switch 9 are connected to the inputs of processing unit 10, which is partially shown and not described in detail. In the circuit of FIG. 1, the control of optocoupler 2 is proportional to the input current of the interface circuit, that is, to the current in resistor R. When switch 31 is off, the photodiode is not supplied and switch 9 is off. When switch 31 is on, a current flows through resistors R, R1, and R2. The voltage filtered across capacitor C biases photodiode 8 which thus turns switch 9 on.

FIG. 2 shows a second conventional example of an interface circuit 11 made in integrated form. As in FIG. 1, sensor 3 is in series with a supply voltage source 4 and a protection resistor R. Interface circuit 11, partially shown, includes a zener diode D12 connected between positive input terminal 6 of circuit 11 and reference terminal 5. A current source 13 is connected in parallel with diode D12 having its anode on the side of terminal 5. Terminal 6 is connected to the inverting input of an amplifier 14, the non-inverting input of which receives a reference current Iref. The output of amplifier 14 forms the output terminal of interface circuit 11 towards isolation barrier 2, for example, an optocoupler (not shown). The function of current source 13 is to provide an impedance matching at the input of amplifier 14 while diode D12 is used to limit this input voltage. According to whether the switch included in sensor 3 is on or off, amplifier 14 assembled as a comparator outputs a zero voltage or a voltage corresponding to its own supply voltage (that is, voltage V).

FIG. 3 shows a third conventional example of an interface circuit 15. In this example, a zener diode D12 is connected to input terminals 6 and 5 of the interface circuit which, as previously, are interconnected by protection resistor R, sensor 3, and voltage source 4 in series. A filtering capacitor C is arranged in parallel with optocoupler 2. The most positive terminal corresponding to a first electrode of capacitor C is connected to the cathode of zener diode D12 by current source 16. If necessary, a second zener diode D17 is connected in parallel with capacitor C. As in the circuit of FIG. 2, the current limiter is only used to match the input impedance of the circuit.

Although, most often, the galvanic isolation element is formed by an optocoupler, other circuits, for example with a transformer or a capacitor, may be encountered. In this case, the matching circuit is associated with an oscillator.

Most often, several interface circuits are associated on a same input/output card. Such a logic input/output card gathers, for example, 4, 8, 16, or 32 inputs.

A disadvantage common to conventional solutions is the necessary use of a protection resistor R between the sensor and the interface circuit. This resistor generates a dissipation which is to be multiplied by the number of logic inputs.

The circuits of FIGS. 2 and 3 form so-called "rail-to-rail" circuits, in which the two supply terminals are connected by diodes. A problem which is posed in such circuits is that in the presence of an overload, said overload is sent onto the supply voltage which is, conversely, generally desired to be stabilized.

An additional constraint of current-limiting circuits to which the present invention more specifically applies is that if the current flowing through the sensor is less than a given current, the output logic state must remain at zero. In other words, the optocoupler must remain off for a current un under a given threshold. In practice, standards set this threshold to a few milliamperes (for example, 1.5 milliampere).

SUMMARY OF THE INVENTION

An object of the present invention is to provide an interface circuit which enables respecting a current activation threshold.

Another object of the present invention is to reduce or minimize the number of components on an input/output card provided with logic interface circuits.

The present invention also aims at reducing or minimizing losses in each input interface circuit.

The present invention more generally aims at improving the quality and the immunity to noise of the logic information transfer from a sensor to a processing unit or the like. In particular, the interface circuit must resist electromagnetic disturbances.

In a specific application of the present invention where the photodiode of the optocoupler is in series with the current-limiting element, the obtaining of an activation threshold smaller than the supply voltage of the interface circuit is an additional difficulty. Indeed, the voltage across the photodiode (and possibly the additional voltage of a light-emitting diode) adds to the voltage across the current-limiting element.

To achieve these and other objects, the present invention provides a circuit of interface between a logic sensor and a logic input isolation barrier of a processing circuit, including:

an element of protection against input overvoltages;

a current-limiting circuit connected in series between an input terminal and an output terminal of the interface circuit; and a control stage connected in parallel with the galvanic isolation element to be controlled, to control the logic states thereof, the control stage inhibiting the operation of the galvanic isolation element if the input current is smaller than a predetermined threshold.

According to an embodiment of the present invention, the current-limiting circuit is formed of a first element pulling a portion of the input current to a reference voltage and of a second element connected in series between the input and output terminals of the interface circuit.

According to an embodiment of the present invention, the control stage is formed of a comparator, a first input of which receives a predetermined current reference to be compared with an image of the current at the circuit input.

According to an embodiment of the present invention, the first current-limiting element is formed of three mirror-assembled transistors, a first transistor being associated with a voltage reference circuit while a second transistor is associated with a reference resistor, a third transistor connecting the input and output terminals of the circuit.

According to an embodiment of the present invention, a fourth follower-assembled transistor is interposed between the second transistor and the reference resistor.

According to an embodiment of the present invention, a starting resistor is connected in parallel on the first transistor.

The foregoing objects, features and advantages of the present invention, will be discussed in detail in the following non-limiting description of specific embodiments in connection with the accompanying drawings.

DETAILED DESCRIPTION

Figure 1:
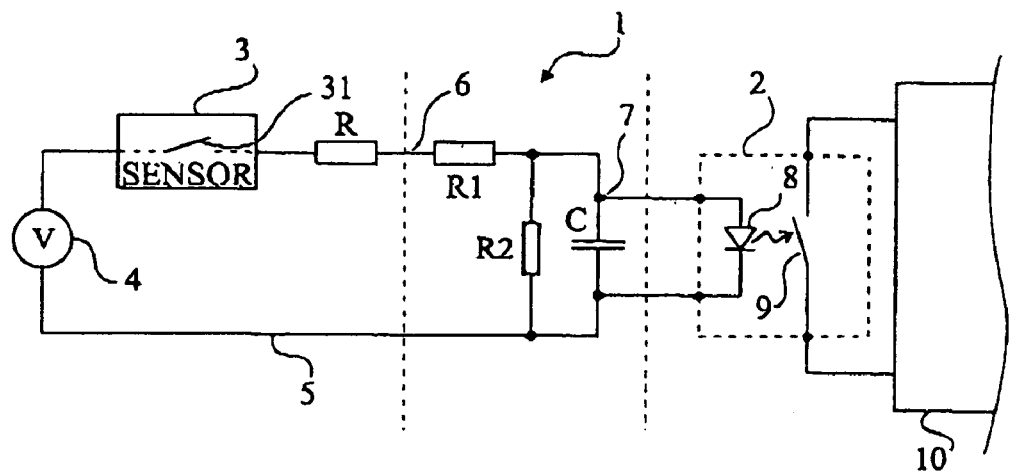
FIGS. 1 to 3, previously described, are intended to show the state of the art and the problem to solve.
Figure 2:
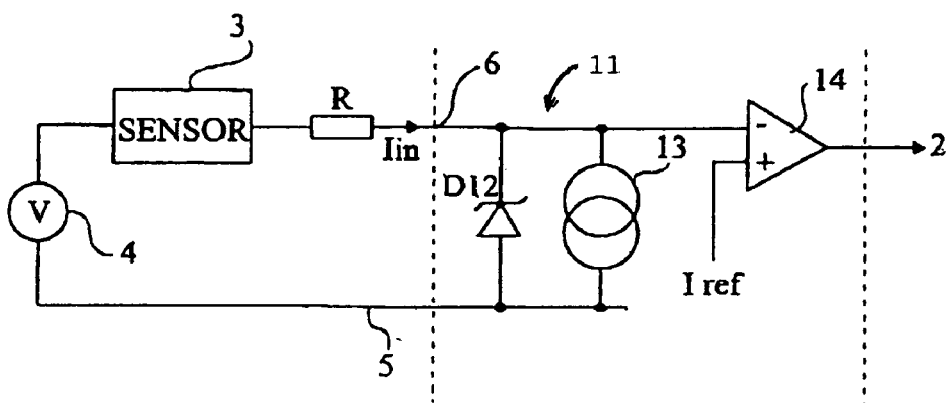

The same elements have been designated with same references in the different drawings. For clarity, only those components of the interface circuit which are useful to the understanding of the present invention have been shown in the drawings and will be described hereafter.

Figure 4:
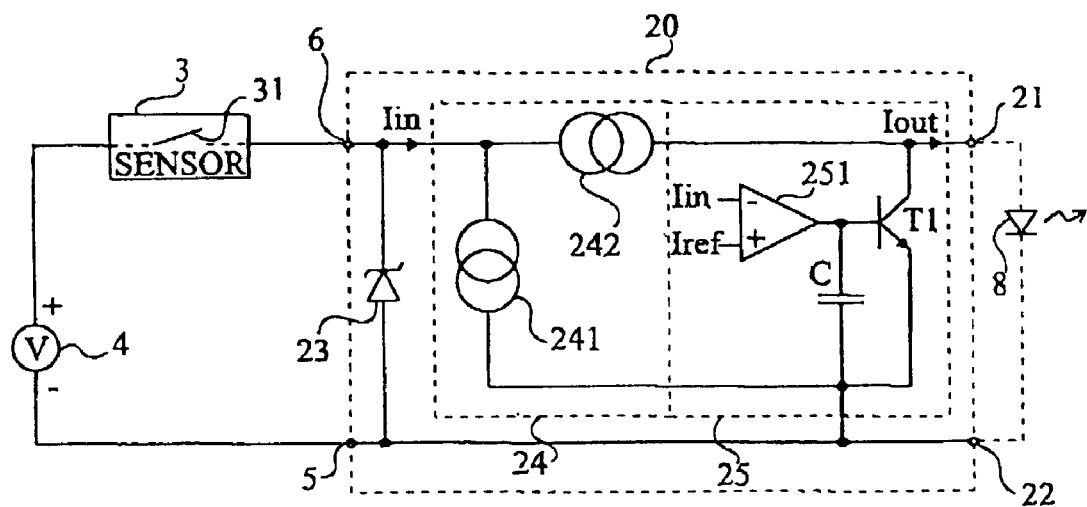
FIG. 4 very schematically shows an embodiment of an interface circuit according to the present invention.

FIG. 4 very schematically shows an embodiment of an interface circuit according to the present invention. As previously, integrated interface circuit 20 is intended to receive on an input 6 a current Iin from a sensor 3 formed by a logic switch 31. The sensor is powered by a voltage source 4 and is connected in series with source 4 between terminal 6 and a terminal 5 forming a reference voltage (generally, the ground).

Circuit 20 includes an output terminal 21 intended to be connected to an isolation barrier, preferably, a photodiode 8 of a partially shown optocoupler, the anode of the photodiode being connected to terminal 21 while its cathode is connected to the reference voltage (for example, to a terminal 22 of integrated circuit 20 connected to terminal 5).

Circuit 20 essentially includes:

an element 23 of protection against overvoltages. This element is, for example, formed of a zener diode connected between input terminals 6 and 5, the cathode of the zener diode being connected to terminal 6;

a current-limiting circuit 24 arranged in series with the sensor and intended to match the input impedance of the circuit; and a control stage 25 of the optocoupler connected in parallel with the galvanic isolation element and which controls the logic states thereof.

A feature of the present invention is that series current-limiting circuit 24 is not of resistive type. As can be noted in FIG. 4, no limiting resistor is provided between sensor 3 and the interface circuit. In other words, the losses generated by the limiting element are proportional to the voltage and not to the square of this voltage as in the case of a resistive element.

According to the preferred embodiment of the present invention illustrated in FIG. 4, current-limiting circuit 24 is formed of a first limiting element 241 connected between terminal 6 and the ground, and which is thus intended to shunt part of the current to ground, and of a second limiting element 242 connected between terminals 6 and 21, that is, in series with the sensor and the optocoupler. The ratio between the currents flowing through elements 241 and 242 depends on the application. For example, the series limiting element shunts 75% of current Iin while the parallel limiting element shunts 25% thereof. Output current Iout directed to the optocoupler is then smaller than input current Iin.

Such a configuration makes the activation threshold of the interface circuit less sensitive to the voltage of the output circuit (the optocoupler).

Control stage 25 is essentially formed of a comparator 251, a first (non-inverting) input of which receives an image voltage of a reference current Iref and a second (inverting) input of which receives an image voltage of input current Iin. The output of comparator 251 controls a switch T1 (in this example, a bipolar NPN-type transistor), which is connected in parallel with the galvanic isolation circuit (more specifically, photodiode 8). The output of comparator 251 is further grounded by means of a capacitor C to delay its transitions and improve the circuit immunity when it is submitted to fast transitions.

Figure 5:
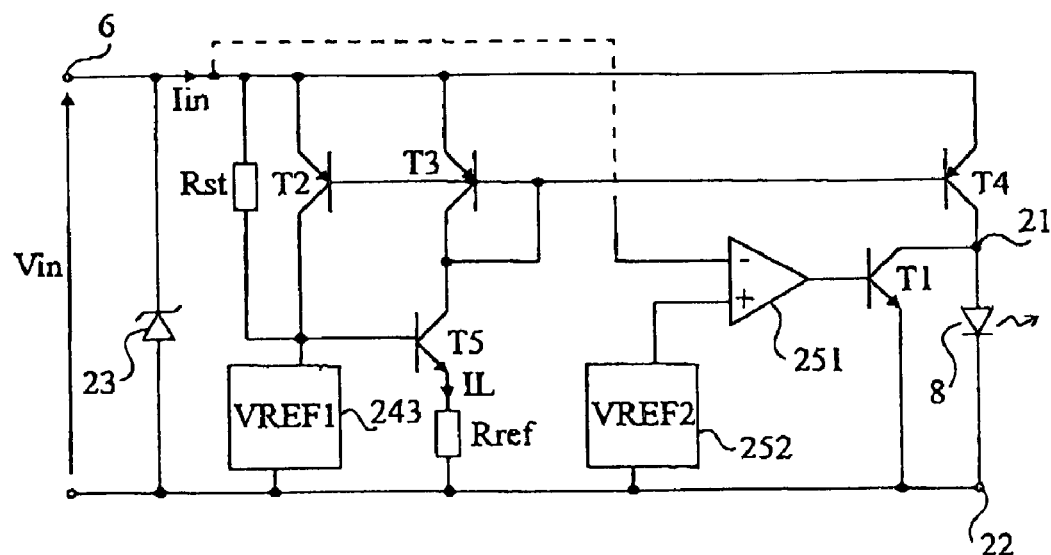
FIG. 5 shows a more detailed electric diagram of an embodiment of an interface circuit according to the present invention.

FIG. 5 shows a more detailed diagram of the interface circuit of FIG. 4. Current-limiting circuit 24 is mainly formed of three mirror-assembled bipolar transistors T2, T3, and T4 (PNP), of a voltage reference circuit 243 (VREF1), and of a bipolar transistor T5 (NPN) assembled as a voltage follower. Transistors T2, T3, and T4 have their respective emitters connected to terminal 6 and have interconnected bases. The collector of transistor T2 is connected to terminal 22 by voltage reference circuit 243. Transistor T3 has its base connected to its collector. The collector of transistor T3 is connected to terminal 22 by transistor T5 in series with a resistor Rref, the collector of transistor T5 being connected to the collector of transistor T3. The base of transistor T5 is connected to the collector of transistor T2 and, by a starting resistor Rst, to terminal 6. The collector of transistor T4 is connected to output terminal 21.

Current-limiting circuit is set by the current flowing through resistor Rref. Current IL is equal to VL/Rref, where VL represents the voltage across resistor Rref, or VREF1−VBE/Rref, where VBE represents the base-emitter voltage of transistor T5. Current IL runs through transistor T3 and is copied in transistor T4, which has the function of supplying the optocoupler with current.

Circuit 243 is, preferably, a circuit of bandgap type calibrated in such a way that it compensates the temperature coefficient of resistor Rref. If the temperature coefficient is positive, the voltage across resistor Rref will be higher at high temperature than at low temperature. The operating principle of the bandgap circuit is based on the putting in series of a diode (having a negative temperature coefficient) with a resistor having a current with a positive temperature coefficient. According to the value of this resistor, the resulting reference voltage may be stable in temperature, increase, or decrease with temperature.

The forming of a voltage reference circuit of bandgap type is known and needs not be detailed any further. Such a forming and the choice of the temperature behavior according to the application are within the abilities of those skilled in the art.

Resistor Rst is used to start the circuit by providing a current to circuit 243 across which the voltage increases until the circuit starts. Transistor T2 then has the function of supplying circuit 243 in parallel with resistor Rst. The current through transistor T2 is proportional to that running through transistor T3. The value of resistor Rst is sufficiently high (for example, several hundred kilo-ohms) to avoid influencing the ratio between current Iin and voltage Vin.

In FIG. 5, control circuit 25 formed of comparator 251 also appears. In practice, a reference voltage VREF2 which is an image of a reference current Iref is generated by a circuit 252 to be provided to the non-inverting input of comparator 251. For example, circuit 252 is based on a second temperature-compensated voltage reference circuit of bandgap type. Filtering capacitor C has not been shown. It will however generally be present. The negative input of comparator 251 draws an image of the input current by any adapted means.

Current reference Iref of comparator 251 corresponds to the threshold current short of which the logic current must not switch. Referring to the preceding example, current Iref is on the order of a few milliamperes (for example, 1.5 milliamperes). If current Iin is smaller than the reference, the output current is zero. If it is greater than the reference, the output current is equal to a portion of the input current (for example, 75% due to the pulling performed by current source 241 in parallel).

Figure 3:
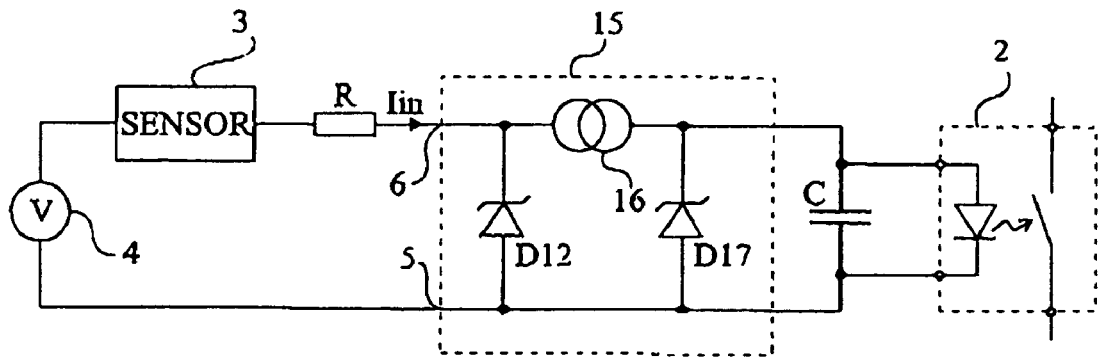

Optionally, a second zener diode (not shown) of protection against overvoltages of the type of diode D17 of FIG. 3 may be provided in parallel with diode 8 of the optocoupler.

Of course, the present invention is likely to have various alterations, modifications, and improvements which will readily occur to those skilled in the art. In particular, the practical implementation of temperature-compensated voltage reference circuits will be chosen according to the application. Further, the number of interface circuits associated on an input/output card depends on the application. It should only be noted that the present invention has the advantage of reducing or minimizing the dissipation within the card by individually reducing losses within each interface circuit. Further, the element of protection against overvoltages 23 is integrated with the interface circuit specific to each logic input. Accordingly, in an input/output card provided with several circuits, each input has its own protection against overvoltages. This eliminates any parasitic path on the supply lines, which would appear with a centralized protection against overvoltages.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A circuit for interface between a logic sensor and a logic input isolation barrier of a processing circuit, including:
   an element of protection against input overvoltages;
   a current-limiting circuit including a series connection between an input terminal and an output terminal of the interface circuit; and
   a control stage connected in parallel with a galvanic isolation element to be controlled, to control the logic states thereof, the output terminal of the interface circuit adapted for connection to the galvanic isolation element, the control stage inhibiting the operation of the galvanic isolation element if an input current is smaller than a predetermined threshold.

2. The circuit of claim 1, wherein the current-limiting circuit is formed of a first sub-circuit pulling a portion of the input voltage to a reference voltage and of a second sub-circuit connected in series between the input and output terminals of the interface circuit.

3. The circuit of claim 1, wherein the control stage is formed of a comparator, a first input of which receives a predetermined current reference to be compared with an image of the current at the circuit input.

4. The circuit of claim 2, wherein the current-limiting circuit is formed of three mirror-assembled transistors, a first transistor being associated with a voltage reference circuit while a second transistor is associated with a reference resistor, a third transistor connecting the input and output terminals of the interface circuit.

5. The circuit of claim 4, wherein a fourth follower-assembled transistor is interposed between the second transistor and the reference resistor.

6. The circuit of claim 4, wherein a starting resistor is connected in parallel with the first transistor.

7. An interface circuit for use between a sensor and an isolation element, comprising:
   a current-limiting circuit including a series connection between an input terminal and an output terminal of the interface circuit; and
   a control stage for connection in parallel with the isolation element to control a logic state thereof in response to an input current, the output terminal of the interface circuit adapted for connection in the isolation element.

8. An interface circuit as defined in claim 7, further comprising:
   an element for protection against input over voltages.

9. An interface circuit as defined in claim 7, wherein the current-limiting circuit comprises a first current limiting sub-circuit connected between the input terminal and a reference voltage, and a second current limiting sub-circuit connected in series between the input and output terminals.

10. An interface circuit as defined in claim 9, wherein the current-limiting circuit element comprises a first transistor associated with a voltage reference circuit, a second transistor associated with a reference resistor and a third transistor connecting the input and output terminals of the interface circuit, wherein the first, second and third transistors are connected in a current mirror configuration.

11. An interface circuit as defined in claim 10, wherein the first current-limiting circuit further comprises a follower transistor between the second transistor and the reference resistor.

12. An interface circuit as defined in claim 10, wherein a starting resistor is connected in parallel with the first transistor.

13. An interface circuit as defined in claim 7, wherein the control stage comprises a comparator having a first input which receives a current reference and a second input which receives an image of the input current.

14. An interface circuit as defined in claim 13, wherein the comparator is configured to inhibit operation of the isolation element when the input current is smaller than a predetermined threshold current.

* * * * *

UNITED STATES PATENT AND TRADEMARK OFFICE
CERTIFICATE OF CORRECTION

PATENT NO. : 7,091,633 B2 Page 1 of 1
APPLICATION NO. : 10/242518
DATED : August 15, 2006
INVENTOR(S) : Thierry Castagnet and Olivier Ladiray It is certified that error appears in the above-identified patent and that said Letters Patent is hereby corrected as shown below:

Col. 2, line 39, should read:
--words, the optocoupler must remain off for a current Iin--

Col. 4, line 32, should read:
--element shunts 25% thereof. Output current Iout directed to--

Signed and Sealed this

Thirty-first Day of October, 2006

JON W. DUDAS
*Director of the United States Patent and Trademark Office*